United States Patent
Park et al.

(10) Patent No.: US 10,170,649 B2
(45) Date of Patent: Jan. 1, 2019

(54) METAL CHALCOGENIDE NANOPARTICLES FOR PREPARING LIGHT ABSORPTION LAYER OF SOLAR CELLS AND METHOD OF PREPARING THE SAME

(71) Applicant: LG CHEM, LTD., Seoul (KR)

(72) Inventors: Eunju Park, Daejeon (KR); Seokhee Yoon, Daejeon (KR); Seokhyun Yoon, Daejeon (KR); Hosub Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/638,240

(22) Filed: Jun. 29, 2017

(65) Prior Publication Data

US 2017/0301806 A1    Oct. 19, 2017

Related U.S. Application Data

(62) Division of application No. 14/917,265, filed as application No. PCT/KR2014/008181 on Sep. 2, 2014, now abandoned.

(30) Foreign Application Priority Data

Sep. 12, 2013   (KR) .................. 10-2013-0109717

(51) Int. Cl.
| | |
|---|---|
| *H01B 1/02* | (2006.01) |
| *H01L 31/032* | (2006.01) |
| *H01B 1/10* | (2006.01) |
| *H01L 31/0445* | (2014.01) |
| *H01L 31/072* | (2012.01) |
| *H01L 31/0296* | (2006.01) |
| *H01L 31/0352* | (2006.01) |
| *B82Y 40/00* | (2011.01) |
| *B82Y 30/00* | (2011.01) |

(52) U.S. Cl.
CPC ............. *H01L 31/032* (2013.01); *H01B 1/02* (2013.01); *H01B 1/10* (2013.01); *H01L 31/0296* (2013.01); *H01L 31/0326* (2013.01); *H01L 31/035218* (2013.01); *H01L 31/0445* (2014.12); *H01L 31/072* (2013.01); *B82Y 30/00* (2013.01); *B82Y 40/00* (2013.01); *Y02E 10/50* (2013.01)

(58) Field of Classification Search
CPC ......... H01B 1/02; H01B 1/10; H01L 31/0322; H01L 31/0352; B82Y 30/00; B82Y 40/00
See application file for complete search history.

(56) References Cited

U.S. PATENT DOCUMENTS

| | | | |
|---|---|---|---|
| 2012/0100660 A1 | 4/2012 | Hagedorn et al. | |
| 2012/0220066 A1 | 8/2012 | Cao | |
| 2012/0288987 A1* | 11/2012 | Radu .................. | B82Y 30/00 |
| | | | 438/95 |
| 2013/0037110 A1 | 2/2013 | Mitzi et al. | |
| 2013/0095602 A1 | 4/2013 | Johnson et al. | |
| 2013/0125988 A1 | 5/2013 | Cao et al. | |

FOREIGN PATENT DOCUMENTS

| | | |
|---|---|---|
| CN | 102612486 A | 7/2012 |
| CN | 102668021 A | 9/2012 |
| CN | 102906014 A | 1/2013 |
| KR | 10-2012-0085331 A | 7/2012 |
| TW | 201117412 A1 | 5/2011 |
| WO | WO 2012/037276 A1 | 3/2012 |

OTHER PUBLICATIONS

International Search Report for PCT/KR2014/008181 filed Sep. 2, 2014.
Jongpil Park et al., "Syntheses of $Cu_2SnS_3$ and $Cu^2ZnSnS_4$ nanoparticles with tunable Zn/Sn ratios under multibubble sonoluminescence conditions", Dalton Transactions, May 22, 2013, pp. 10545-10550, vol. 42, The Royal Society of Chemistry.
Qijie Guo et al., "A Simple Solution-based Route to High-Efficiency CZTSSe Thin-film Solar Cells", 2011, pp. 2993-2996, IEEE.

\* cited by examiner

*Primary Examiner* — Haidung D Nguyen

(57) ABSTRACT

Disclosed are metal chalcogenide nanoparticles forming a light absorption layer of solar cells including a first phase including copper (Cu)-tin (Sn) chalcogenide and a second phase including zinc (Zn) chalcogenide, and a method of preparing the same.

17 Claims, 14 Drawing Sheets

[FIG. 1]
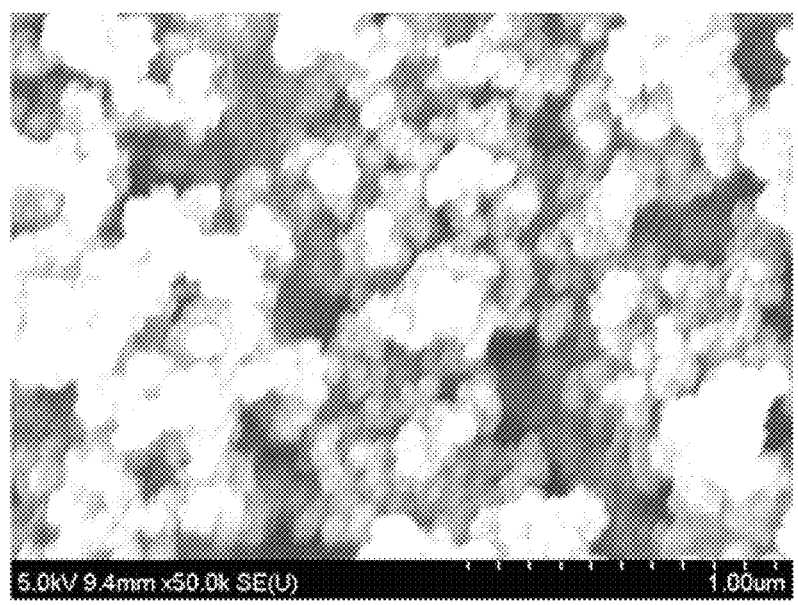
[FIG. 2]
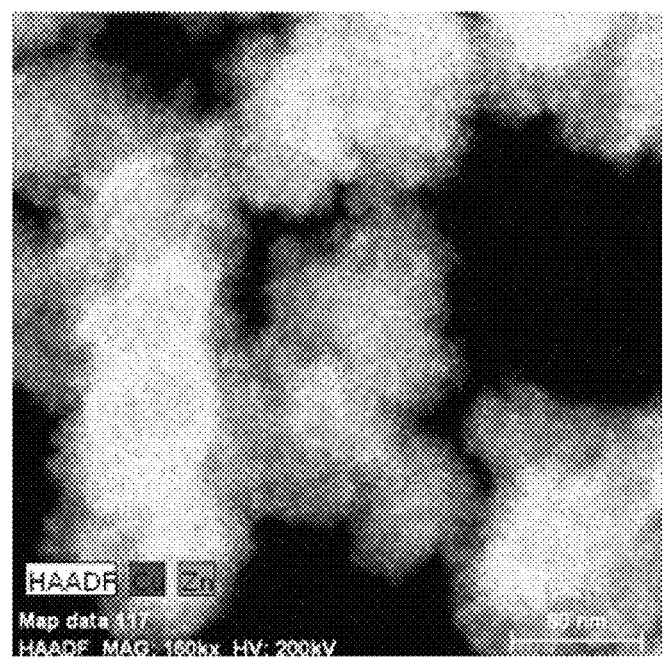

[FIG. 3]
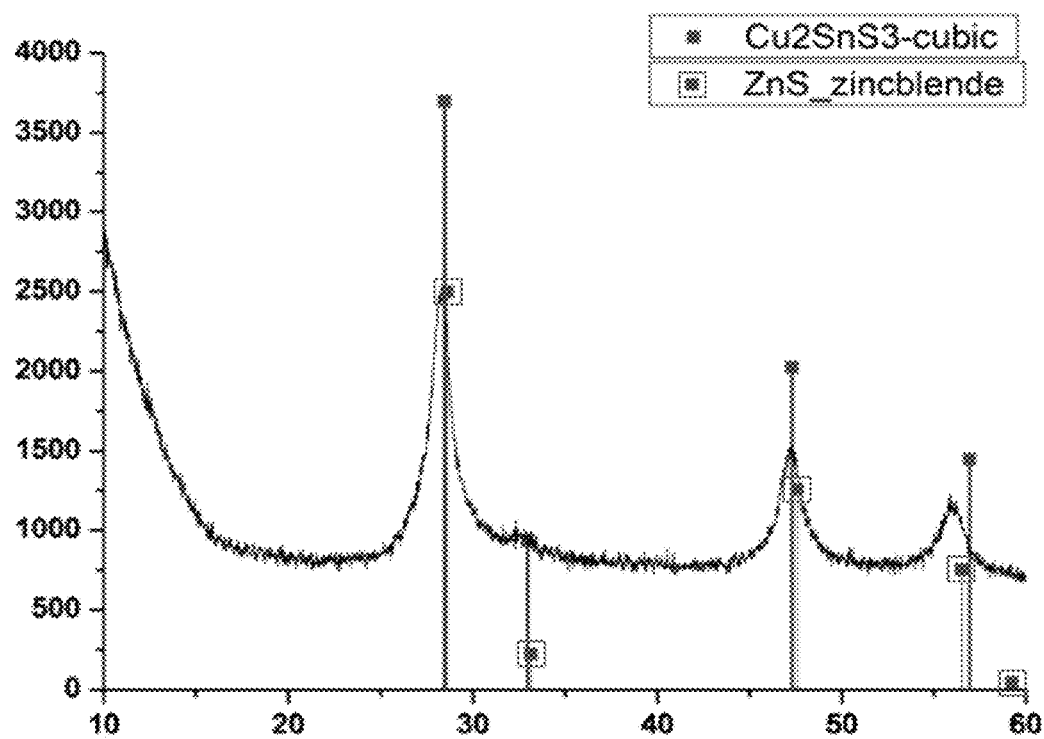

[FIG. 4]
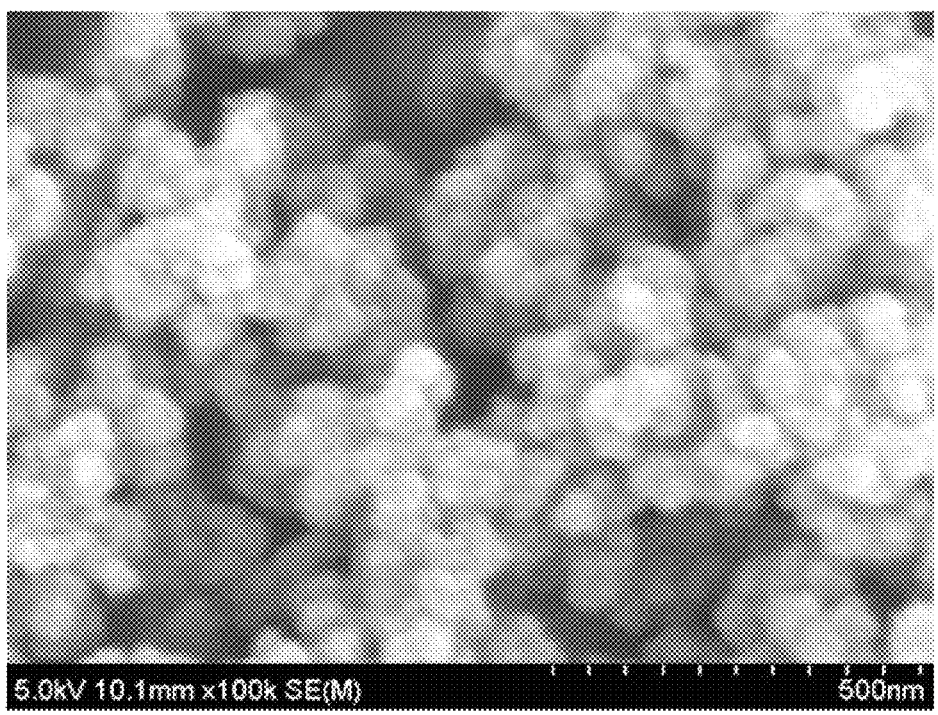

[FIG. 5]
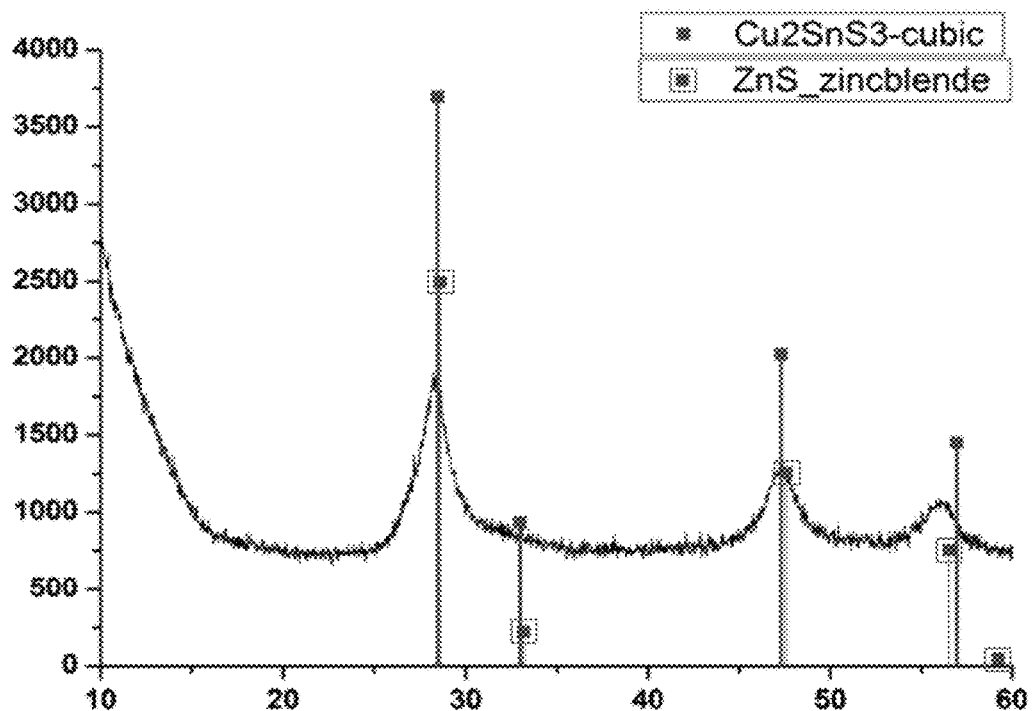
[FIG. 6A]
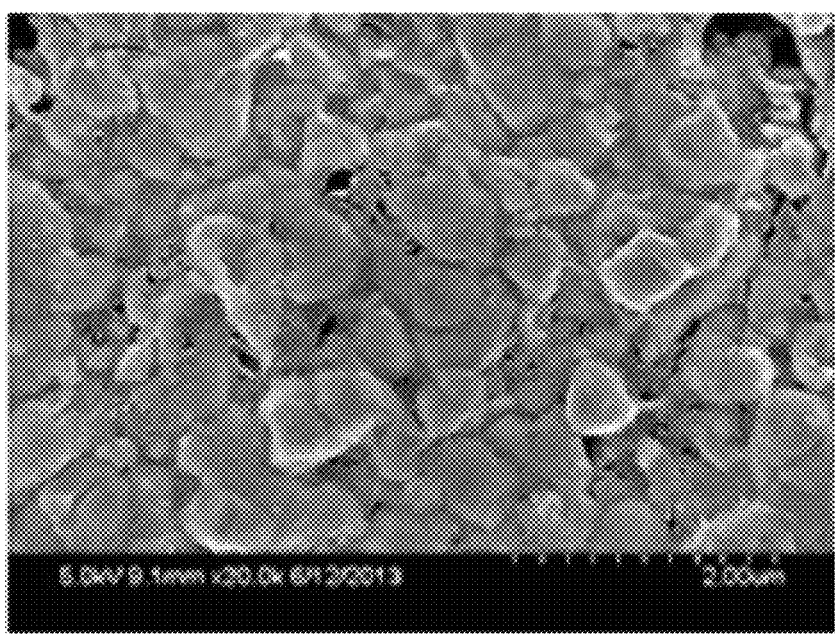

[FIG. 6B]
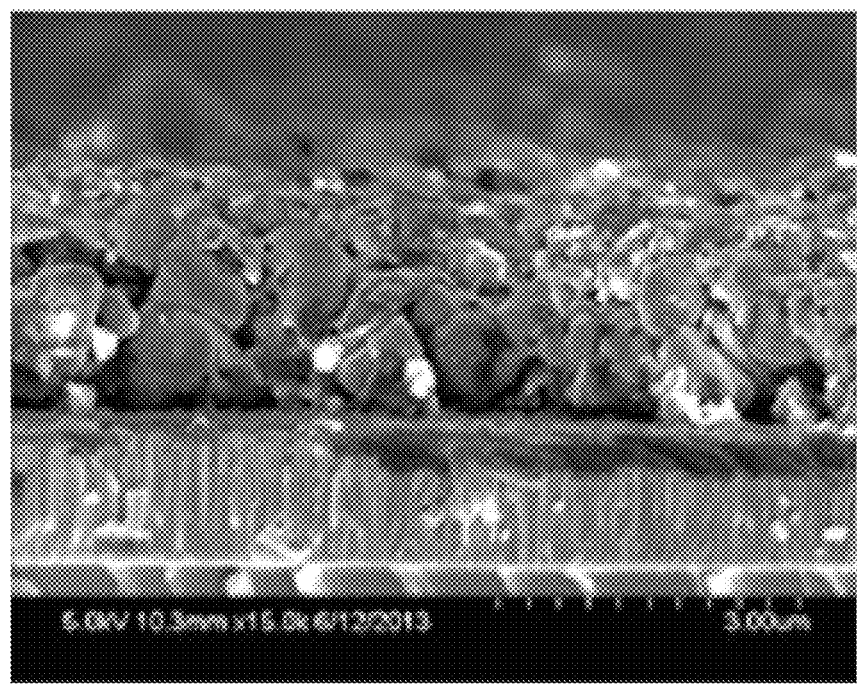
[FIG. 7]
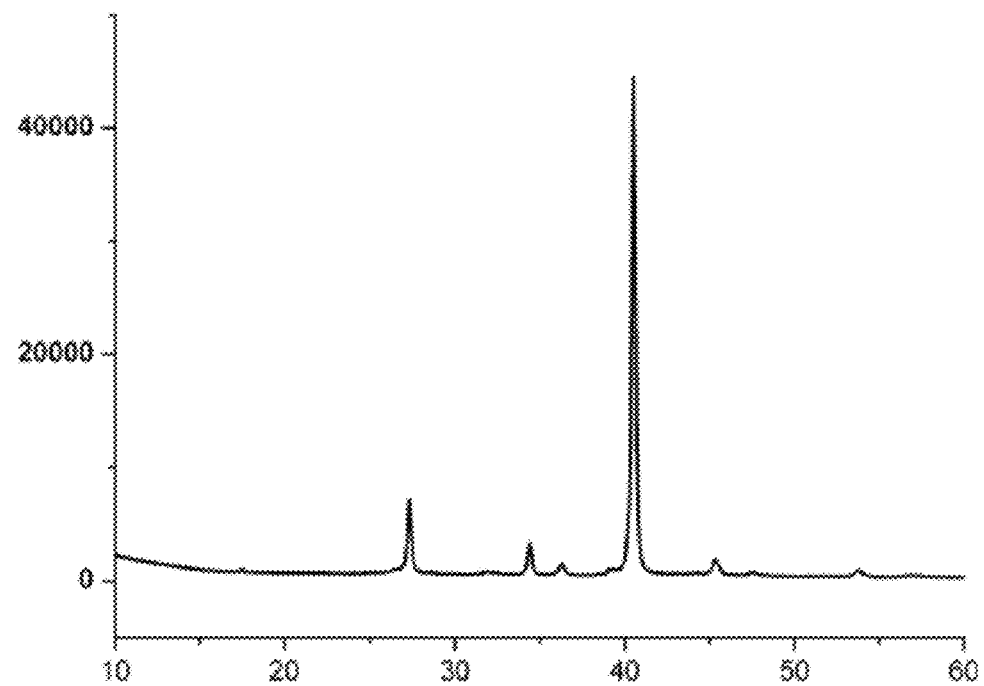

[FIG. 8]
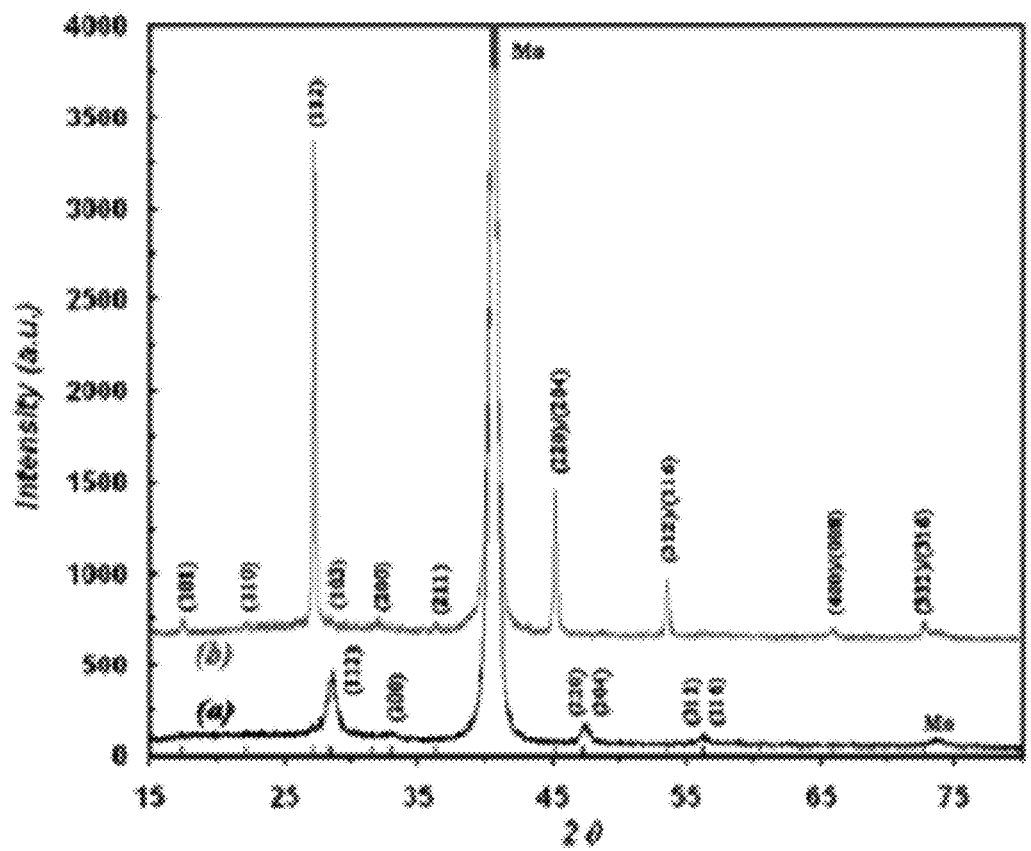

[FIG. 9]
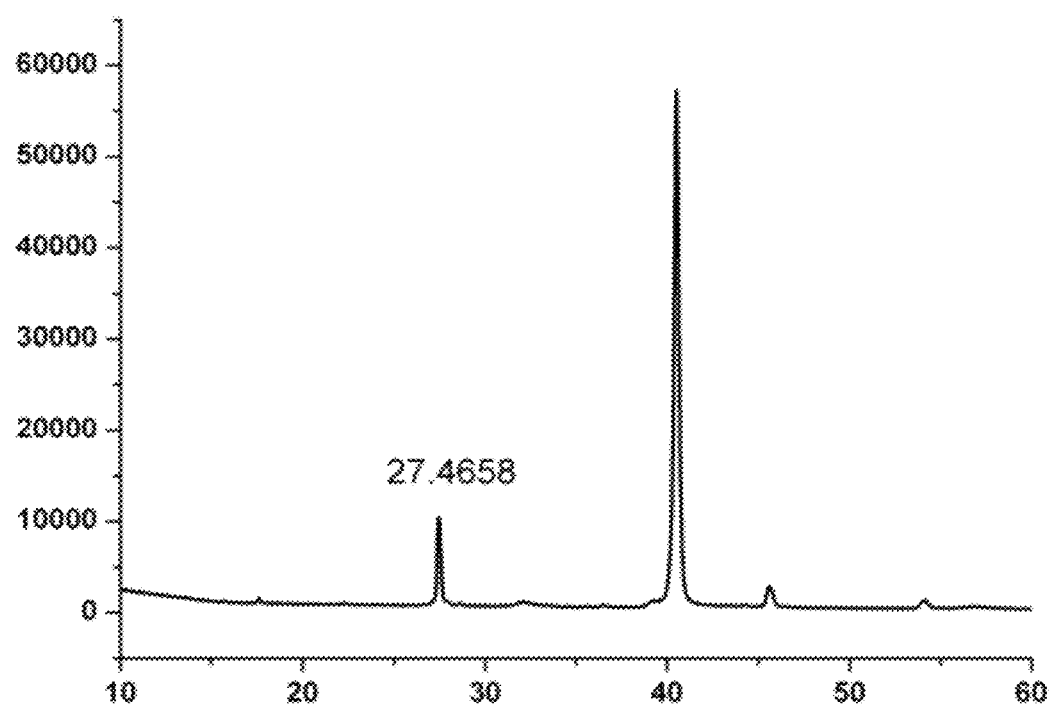

[FIG. 10]
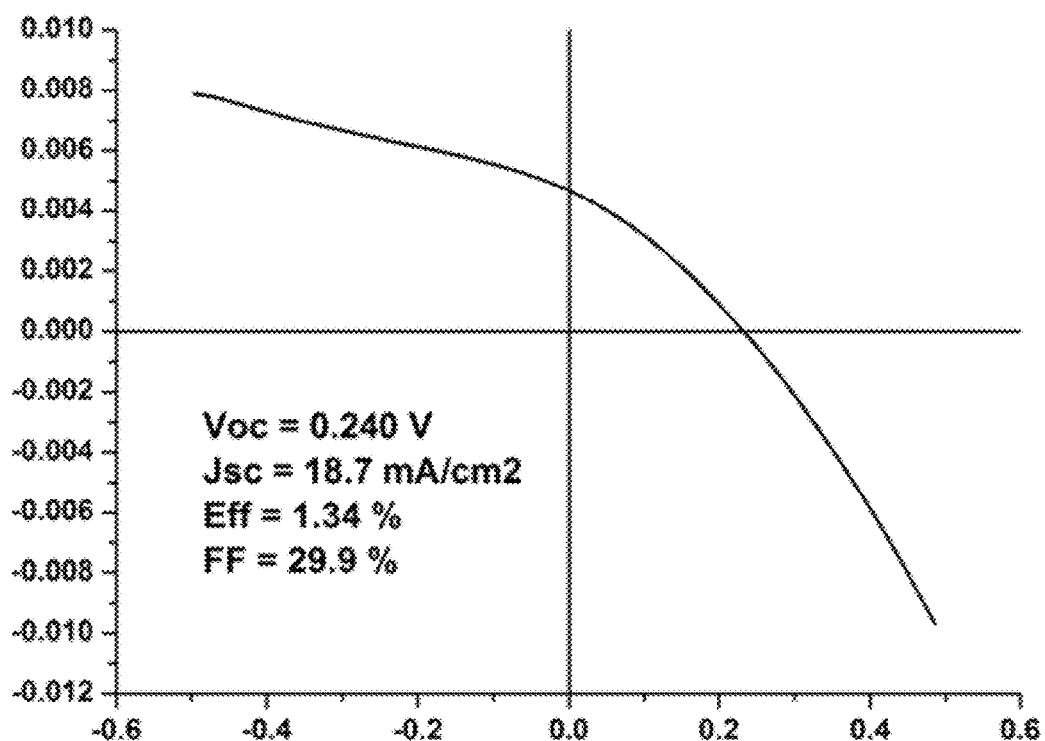

[FIG. 11]
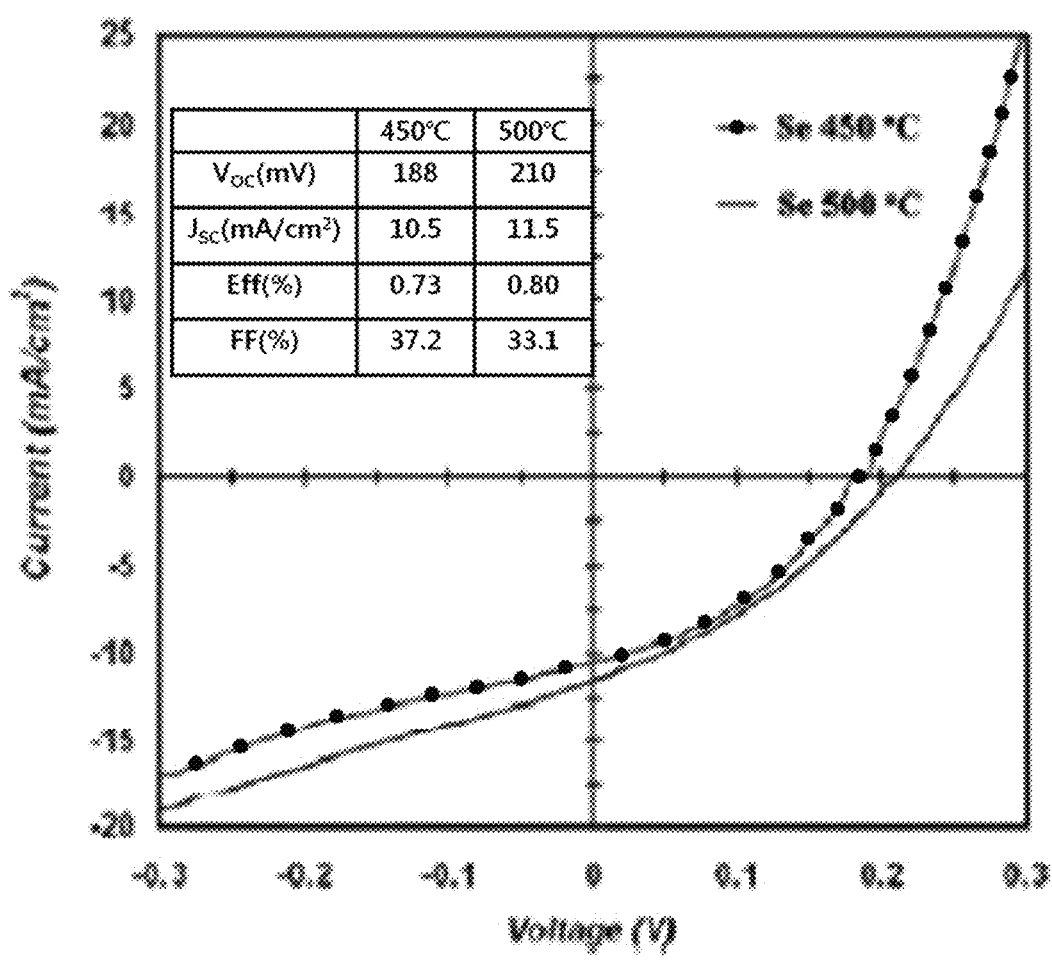

[FIG. 12]
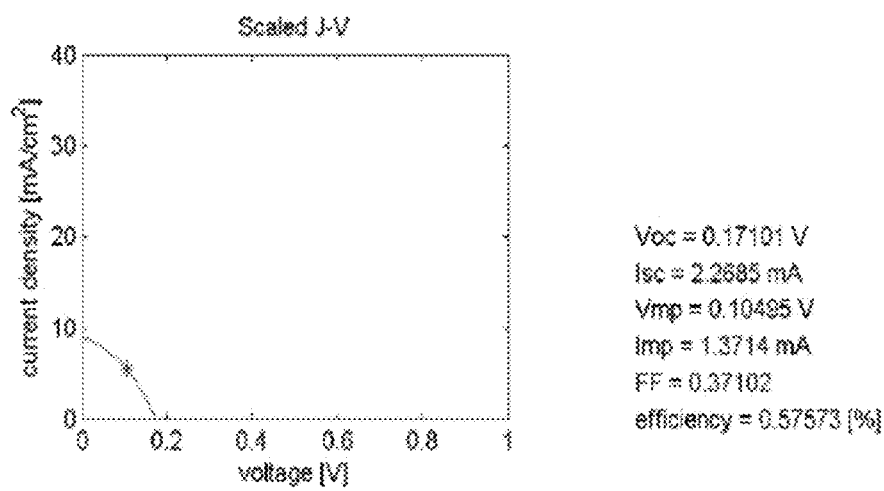
[FIG. 13]
|  | Point 1 | Point 2 |
|---|---|---|
| S K | 50.95 | 50.89 |
| Cu K | 21.77 | 21.56 |
| Zn K | 16.22 | 15.64 |
| Sn L | 11.05 | 11.91 |

[FIG. 14A]
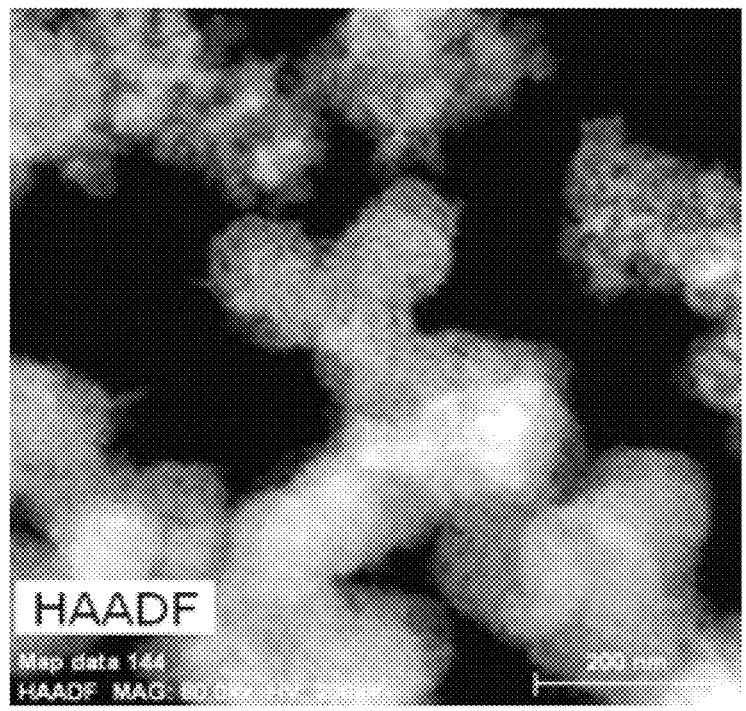
[FIG. 14B]
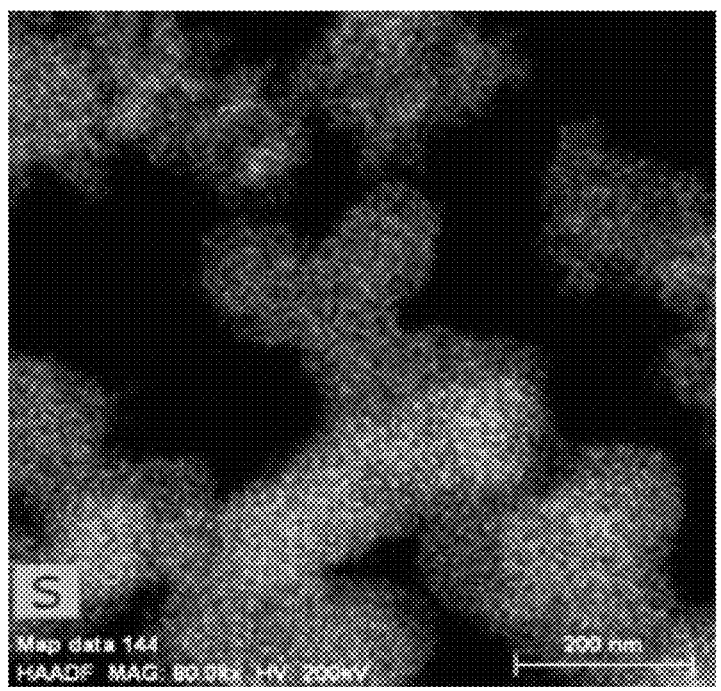

[FIG. 14C]
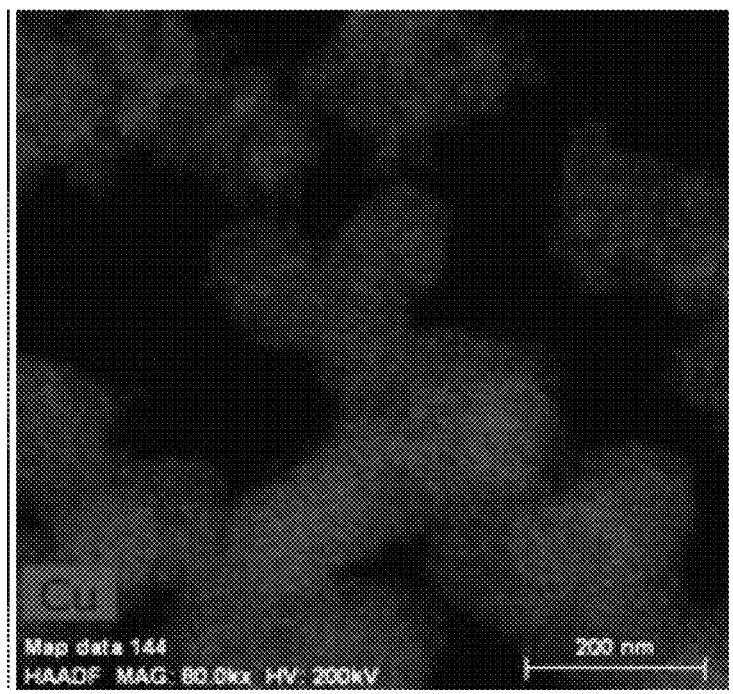
[FIG. 14D]
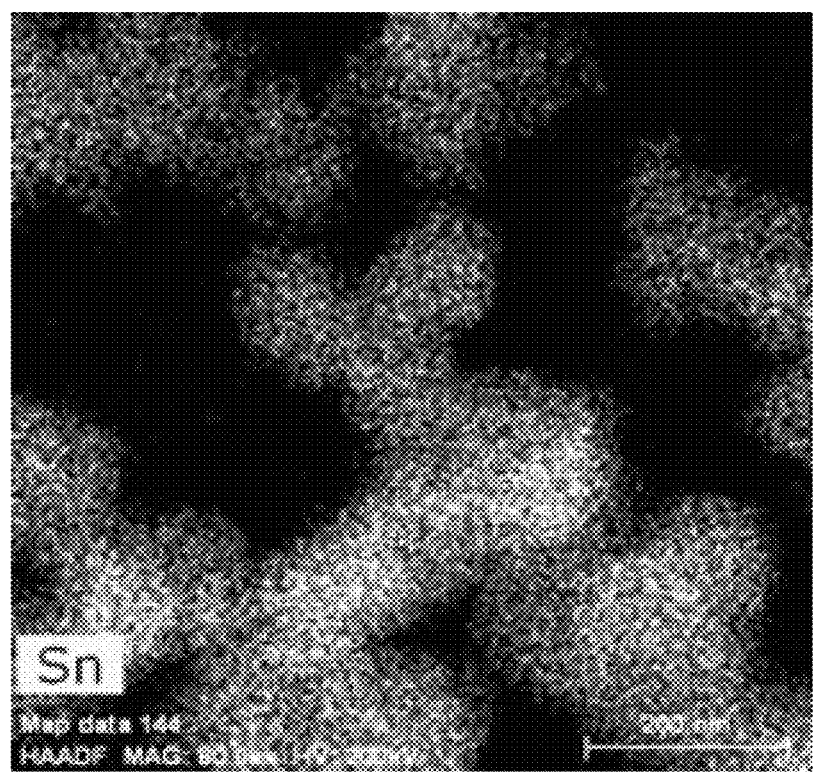

[FIG. 14E]
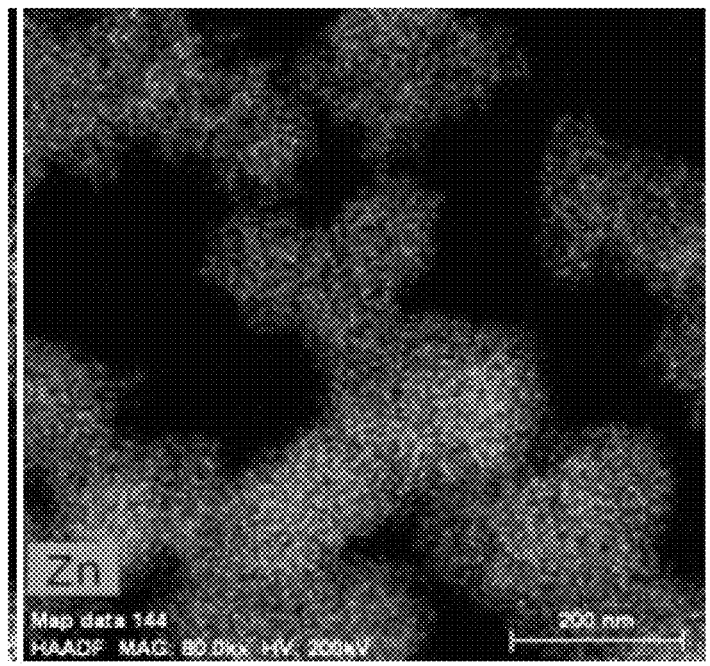
[FIG. 15A]
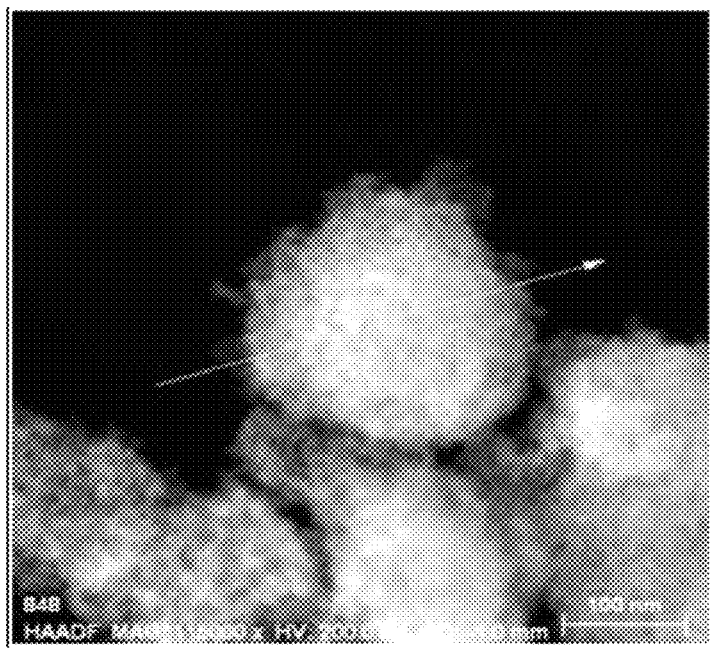

[FIG. 15B]
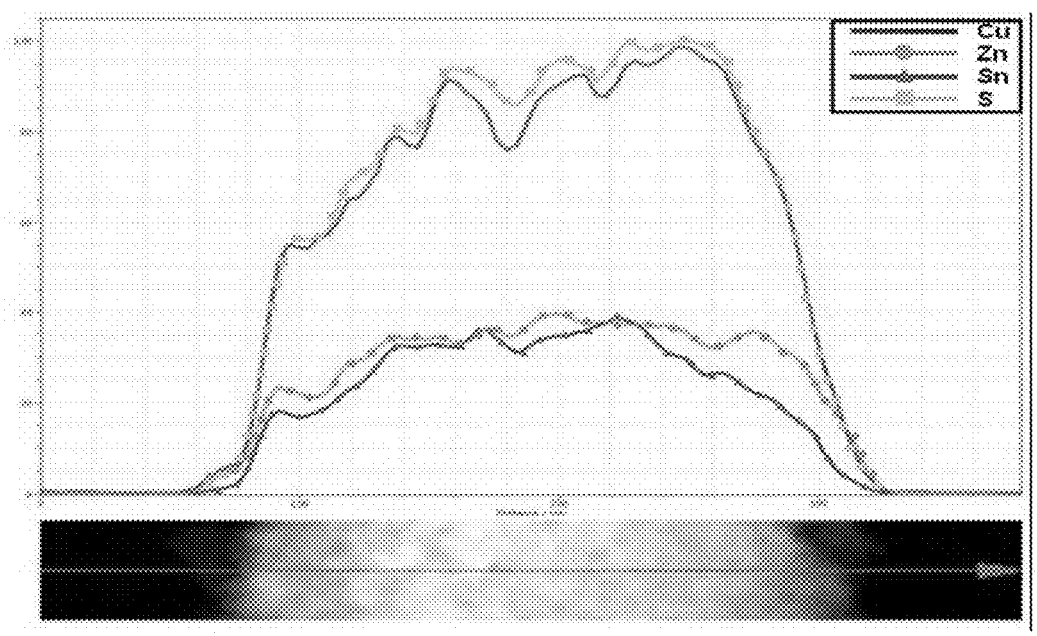

METAL CHALCOGENIDE NANOPARTICLES FOR PREPARING LIGHT ABSORPTION LAYER OF SOLAR CELLS AND METHOD OF PREPARING THE SAME

CROSS REFERENCE TO RELATED APPLICATIONS

The present invention is a divisional of U.S. patent application Ser. No. 14/917,265, filed on Mar. 7, 2016, which is a U.S. National Stage of PCT/KR2014/008181, filed on Sep. 2, 2014, which claims the priority of Korean Patent Application No. 10-2013-0109717, filed on Sep. 12, 2013, which are incorporated herein by reference.

TECHNICAL FIELD

The present invention relates to metal chalcogenide nanoparticles for preparing a light absorption layer of solar cells and a method of preparing the same.

BACKGROUND ART

Solar cells have been manufactured using a light absorption layer formed at high cost and silicon (Si) as a semiconductor material since an early stage of development. To more economically manufacture commercially viable solar cells, structures of thin film solar cells, using an inexpensive light absorbing material such as copper indium gallium sulfo (di) selenide (CIGS) or $Cu(In, Ga)(S, Se)_2$, have been developed. Such CIGS-based solar cells typically include a rear electrode layer, an n-type junction part, and a p-type light absorption layer. Solar cells including such CIGS layers have a power conversion efficiency of greater than 19%. However, in spite of potential for CIGS-based thin film solar cells, costs and insufficient supply of In are main obstacles to widespread commercial application of thin film solar cells using CIGS-based light absorption layers. Thus, there is an urgent need to develop solar cells using In-free or low-cost universal elements.

Accordingly, as an alternative to the CIGS-based light absorption layer, $CZTS(Cu_2ZnSn(S,Se)_4)$-based solar cells including copper (Cu), zinc (Zn), tin (Sn), sulfur (S), or selenium (Se), which are extremely cheap elements, have recently received attention. CZTS has a direct band gap of about 1.0 eV to about 1.5 eV and an absorption coefficient of $10^4$ cm$^{-1}$ or more, reserves thereof are relatively high, and CZTS uses Sn and Zn, which are inexpensive.

In 1996, CZTS hetero junction PV batteries were reported for the first time, but CZTS-based solar cells have less advanced less than CIGS-based solar cells and photoelectric efficiency of CZTS-based solar cells is 10% or less, much lower than that of CIGS-based solar cells. Thin films of CZTS are prepared by sputtering, hybrid sputtering, pulsed laser deposition, spray pyrolysis, electro-deposition/thermal sulfurization, e-beam processing, Cu/Zn/Sn/thermal sulfurization, and a sol-gel method.

Meanwhile, PCT/US2010/035792 discloses formation of a thin film through heat treatment of ink including CZTS/Se nanoparticles on a base. Generally, when a CZTS thin film is formed with CZTS/Se nanoparticles, it is difficult to enlarge crystal size at a forming process of a thin film due to previously formed small crystals. As such, when each grain is small, interfaces are extended and thereby electron loss occurs at interfaces, and, accordingly, efficiency is deteriorated.

Accordingly, nanoparticles used in a thin film must include Cu, Zn and Sn, and must not be a CZTS crystal type. However, metal nanoparticles constituted of a single metal element may be easily oxidized and, at a subsequent process, an oxygen removal process using a large amount of Se and high temperature is required. In addition, when a chalcogenide including each metal is synthesized respectively and mixed, a non-uniform metal composition ratio may raise a problem. Therefore, there is a high need to develop a technology for thin film solar cells including highly efficient light absorption layers that are stable against oxidation and drawbacks of which are minimized due to a homogenous composition.

DISCLOSURE

Technical Problem

Therefore, the present invention has been made to solve the above and other technical problems that have yet to be resolved.

As a result of a variety of intensive studies and various experiments, the inventors of the present invention developed metal chalcogenide nanoparticles including a first phase including copper (Cu)-tin (Sn) chalcogenide and a second phase including zinc (Zn) chalcogenide, and confirmed that, when a thin film was prepared using the metal chalcogenide nanoparticles, generation of a second phase in the thin film may be suppressed, the thin film had an entirely uniform composition and was stable against oxidation by adding S or Se to the nanoparticles, and the amount of a Group VI element in a final thin film was increased, resulting in a superior quality thin film and thus completing the present invention.

Technical Solution

In accordance with one aspect of the present invention, provided are metal chalcogenide nanoparticles forming light absorption layers of solar cells including a first phase including copper (Cu)-tin (Sn) chalcogenide and a second phase including zinc (Zn) chalcogenide.

The term "chalcogenide" of the present invention means a material including a Group VI element, for example, sulfur (S) or selenium (Se). As one embodiment, the copper (Cu)-tin (Sn) chalcogenide may be $Cu_aSnS_b$ (1.2≤a≤3.2 and 2.5≤b≤4.5), and/or $Cu_xSnSe_y$ (1.2≤x≤3.2, 2.5≤y≤4.5), the zinc (Zn)-containing chalcogenide may be ZnS and/or ZnSe.

The two phases constituting the metal chalcogenide nanoparticles independently exist in one metal chalcogenide nanoparticle and a composition ratio of the metal in the metal chalcogenide nanoparticles may be in a range of 0.5≤Cu/(Zn+Sn)≤1.5 and 0.5≤Zn/Sn≤2.0, particularly in a range of 0.7≤Cu/(Zn+Sn)≤1.2 and 0.8≤Zn/Sn≤1.4.

A structure of the metal chalcogenide nanoparticles, namely, a distribution type of the first phase and second phase, which is not specifically limited, may be a type wherein the first phase and second phase are evenly distributed, as illustrated in FIGS. 13 to 15B. The first phase and second phase may exist in a bulk type and thereby may form a complex. Alternatively, the metal chalcogenide nanoparticles may have a core-shell structure in which the first phase forms a core and the second phase forms a shell.

If the metal chalcogenide nanoparticles are evenly distributed, when a certain area in the metal chalcogenide was observed using SEM-EDX or TEM-EDX, composition ratio of metal in the metal chalcogenide nanoparticles in the observed area may be determined in a range of $0.5 \leq Cu/(Zn+Sn) \leq 1.5$ and $0.5 \leq Zn/Sn \leq 2.0$, particularly may be determined in a range of $0.7 \leq Cu/(Zn+Sn) \leq 1.2$ and $0.8 \leq Zn/Sn \leq 1.4$.

When the metal chalcogenide nanoparticles have a core-shell structure, the diameter of the core may be 5 nanometers to 200 nanometers and the thickness of the shell may be 1 nanometer to 100 nanometers in a range corresponding to the volume of the first phase and second phase occupying the nanoparticles, considering the diameter of the core.

Outside the range, when the size of the core is too large, the metal chalcogenide nanoparticles formed into the shell are too large and thereby pores among particles in a final thin film having a thickness of 1 micrometer to 2 micrometers are enlarged. On the other hand, when the size of the core is too small, particles may be easily aggregated. In addition, to provide the final thin film having a proper composition ratio, the thickness of the shell becomes extremely thin and thereby, it is difficult to form the shell to a proper thickness.

Meanwhile, regardless of the shape, a composition ratio of the first phase and second phase occupying in a total of the metal chalcogenide nanoparticles may be determined in a range of $0.5 \leq Cu/(Zn+Sn) \leq 1.5$ and $0.5 \leq Zn/Sn \leq 2.0$, particularly may be determined in a range of $0.7 \leq Cu/(Zn+Sn) \leq 1.2$ and $0.8 \leq Zn/Sn \leq 1.4$.

As a specific embodiment, the metal chalcogenide nanoparticles may include 0.5 mol to 3 mol of a chalcogenide element based on 1 mol of a metal element. Here, the metal element indicates all metal types.

Outside the above range, when too much of the metal element is included, sufficient supply of a Group VI element is impossible and thereby stable phases such as the above metal chalcogenide are not formed and, accordingly, in subsequent processes, phases may be changed and form a second phase or separated metals may be oxidized. On the contrary, when too much of the chalcogenide element is included, a Group VI source is evaporated during a heat treatment process for preparing a thin film and thereby a final thin film may have too many pores.

The present invention also provides a method of synthesizing the metal chalcogenide nanoparticles. The method may particularly include:

(i) preparing a first solution including at least one a Group VI source selected from the group consisting of a compound including (i) sulfur (S) or selenium (Se);

(ii) preparing a second solution including a copper (Cu) salt and tin (Sn) salt and a third solution including a zinc (Zn) salt;

(iii) mixing and reacting the first solution and second solution; and (iv) mixing and reacting the third solution with a reaction product of the mixing and reacting.

That is, the method of preparing metal chalcogenide nanoparticles according to the present invention is performed by a solution process instead of a conventional vacuum process and thereby process costs may be dramatically reduced. In addition, as a solvent to prepare a solution, harmful hydrazine is not used and thereby a risk which may occur in a conventional solution process may be removed.

As a specific embodiment, when the third solution of step (iv) is mixed, a Group VI source may be further added.

As described above, the Group VI source is included in an amount of 0.5 mol to 3 mol based on 1 mol of a metal element. If the first solution includes a sufficient amount of the Group VI source, an additional Group VI source is not required when the third solution is mixed. However, when the first solution does not include a sufficient amount of the Group VI source, a Group VI source may be further added to solve partial deficiency of a Group VI element. Here, the Group VI source may be added considering the amount of a Group VI element existing in a reaction product of the first solution and the second solution.

In a specific embodiment, solvents for the first solution, second solution and third solution may be at least one selected from the group consisting of water, alcohols, diethylene glycol (DEG), oleylamine, ethylene glycol, triethylene glycol, dimethyl sulfoxide, dimethyl formamide, and N-methyl-2-pyrrolidone (NMP). In particular, the alcohol solvents may be methanol, ethanol, propanol, butanol, pentanol, hexanol, heptanol and octanol having 1 to 8 carbons.

In a specific embodiment, the copper (Cu) salt, tin (Sn) salt and zinc (Zn) salt each independently may be at least one salt selected from the group consisting of a chloride, a bromide, an iodide, a nitrate, a nitrite, a sulfate, an acetate, a sulfite, an acetylacetonate and a hydroxide. As the tin (Sn) salt, a divalent or tetravalent salt may be used, but embodiments of the present invention are not limited thereto.

In a specific embodiment, the Group VI source may be at least one salt selected from the group consisting of Se, $Na_2Se$, $K_2Se$, $CaSe$, $(CH_3)_2Se$, $SeO_2$, $SeCl_4$, $H_2SeO_3$, $H_2SeO_4$, $Na_2S$, $K_2S$, $CaS$, $(CH_3)_2S$, $H_2SO_4$, S, $Na_2S_2O_3$ and $NH_2SO_3H$, and hydrates thereof, thiourea, thioacetamide, selenoacetamide and selenourea.

Meanwhile, the first solution to third solution may further comprise a capping agent.

The capping agent is included during a solution process and thereby the size and particle phase of synthesized metal chalcogenide nanoparticles may be controlled. In addition, the capping agent includes atoms such as N, O, S and the like, and thereby the capping agent easily binds to surfaces of metal chalcogenide nanoparticles through lone pair electrons of the atoms and surrounds the surfaces. Accordingly, oxidization of the metal chalcogenide nanoparticles may be prevented.

The capping agent is not particularly limited and may, for example, be at least one selected from the group consisting of polyvinylpyrrolidone, sodium L-tartrate dibasic dehydrate, potassium sodium tartrate, sodium mesoxalate, sodium acrylate, poly(acrylic acid sodium salt), poly(vinyl pyrrolidone), sodium citrate, trisodium citrate, disodium citrate, sodium gluconate, sodium ascorbate, sorbitol, triethyl phosphate, ethylene diamine, propylene diamine, 1,2-ethanedithiol, and ethanethiol.

The present invention also provides an ink composition for preparing light absorption layers including the metal chalcogenide nanoparticles and a method of preparing a thin film using the ink composition.

The method of preparing the thin film according to the present invention includes:

(i) dispersing metal chalcogenide nanoparticles including a first phase including copper (Cu)-tin (Sn) chalcogenide and a second phase including zinc (Zn) chalcogenide in a solvent to prepare an ink;

(ii) coating the ink on a base provided with an electrode; and (iii) drying and then heat-treating the ink coated on the base provided with an electrode.

In a specific embodiment, the solvent of step (i) is not particularly limited so long as the solvent is a general organic solvent and may be one organic solvent selected from among alkanes, alkenes, alkynes, aromatics, ketones, nitriles, ethers, esters, organic halides, alcohols, amines, thiols, carboxylic acids, phosphines, phosphites, phosphates, sulfoxides, and amides or a mixture of at least one organic solvent selected therefrom.

In particular, the alcohols may be at least one mixed solvent selected from among ethanol, 1-propanol, 2-propanol, 1-pentanol, 2-pentanol, 1-hexanol, 2-hexanol, 3-hexanol, heptanol, octanol, ethylene glycol (EG), diethylene glycol monoethyl ether (DEGMEE), ethylene glycol monomethyl ether (EGMME), ethylene glycol monoethyl ether (EGMEE), ethylene glycol dimethyl ether (EGDME), ethylene glycol diethyl ether (EGDEE), ethylene glycol monopropyl ether (EGMPE), ethylene glycol monobutyl ether (EGMBE), 2-methyl-1-propanol, cyclopentanol, cyclohexanol, propylene glycol propyl ether (PGPE), diethylene glycol dimethyl ether (DEGDME), 1,2-propanediol (1,2-PD), 1,3-propanediol (1,3-PD), 1,4-butanediol (1,4-BD), 1,3-butanediol (1,3-BD), α-terpineol, diethylene glycol (DEG), glycerol, 2-(ethylamino)ethanol, 2-(methylamino)ethanol, and 2-amino-2-methyl-1-propanol.

The amines may be at least one mixed solvent selected from among triethyl amine, dibutyl amine, dipropyl amine, butylamine, ethanolamine, diethylenetriamine (DETA), triethylenetetramine (TETA), triethanolamine, 2-aminoethyl piperazine, 2-hydroxyethyl piperazine, dibutylamine, and tris(2-aminoethyl)amine.

The thiols may be at least one mixed solvent selected from among 1,2-ethanedithiol, pentanethiol, hexanethiol, and mercaptoethanol.

The alkanes may be at least one mixed solvent selected from among hexane, heptane, and octane.

The aromatics may be at least one mixed solvent selected from among toluene, xylene, nitrobenzene, and pyridine.

The organic halides may be at least one mixed solvent selected from among chloroform, methylene chloride, tetrachloromethane, dichloroethane, and chlorobenzene.

The nitriles may be acetonitrile.

The ketones may be at least one mixed solvent selected from among acetone, cyclohexanone, cyclopentanone, and acetyl acetone.

The ethers may be at least one mixed solvent selected from among ethyl ether, tetrahydrofuran, and 1,4-dioxane.

The sulfoxides may be at least one mixed solvent selected from among dimethyl sulfoxide (DMSO) and sulfolane.

The amides may be at least one mixed solvent selected from among dimethyl formamide (DMF) and n-methyl-2-pyrrolidone (NMP).

The esters may be at least one mixed solvent selected from among ethyl lactate, γ-butyrolactone, and ethyl acetoacetate.

The carboxylic acids may be at least one mixed solvent selected from among propionic acid, hexanoic acid, meso-2,3-dimercaptosuccinic acid, thiolactic acid, and thioglycolic acid.

However, the solvents are only given as an example, and embodiments of the present invention are not limited thereto.

In some cases, in preparation of the ink, the ink may be prepared by further adding an additive.

The additive may, for example, be at least one selected from the group consisting of a dispersant, a surfactant, a polymer, a binder, a crosslinking agent, an emulsifying agent, an anti-foaming agent, a drying agent, a filler, a bulking agent, a thickening agent, a film conditioning agent, an antioxidant, a fluidizer, a leveling agent, and a corrosion inhibitor. In particular, the additive may be at least one selected from the group consisting of polyvinylpyrrolidone (PVP), polyvinyl alcohol, Anti-terra 204, Anti-terra 205, ethyl cellulose, and DispersBYK110.

A method of forming a coating layer by coating the ink may, for example, be any one selected from the group consisting of wet coating, spray coating, spin-coating, doctor blade coating, contact printing, top feed reverse printing, bottom feed reverse printing, nozzle feed reverse printing, gravure printing, micro gravure printing, reverse micro gravure printing, roller coating, slot die coating, capillary coating, inkjet-printing, jet deposition, and spray deposition.

The heat treatment of step (iii) may be carried out at a temperature of 400 to 900° C.

Meanwhile, a selenization process may be included to prepare the thin film of a solar cell having much higher density. The selenization process may be carried out through a variety of methods.

As a first example, effects obtained from the selenization process may be achieved by preparing an ink by dispersing S and/or Se in a particle type in a solvent with metal chalcogenide nanoparticles in step (i), and by combining the heat treatment of step (iii).

As a second example, effects obtained from the selenization process may be achieved through the heat treatment of step (iii) in the presence of S or Se In particular, S or Se may be present by supplying $H_2S$ or $H_2Se$ in a gaseous state or supplying Se or S in a gaseous state through heating.

As a third example, after step (ii), S or Se may be deposited on the coated base, following by performing step (iii). In particular, the deposition process may be performed by a solution process or a deposition method.

The present invention also provides a thin film prepared using the above-described method.

The thin film may have a thickness of 0.5 μm to 3.0 μm, more particularly 0.5 μm to 2.5 μm.

When the thickness of the thin film is less than 0.5 μm, the density and amount of the light absorption layer are insufficient and thus desired photoelectric efficiency may not be obtained. On the other hand, when the thickness of the thin film exceeds 3.0 μm, movement distances of carriers increase and, accordingly, there is an increased probability of recombination, which results in reduced efficiency.

The present invention also provides a thin film solar cell manufactured using the thin film.

A method of manufacturing a thin film solar cell is known in the art and thus a detailed description thereof will be omitted herein.

BRIEF DESCRIPTION OF THE DRAWINGS

The above and other objects, features and other advantages of the present invention will be more clearly understood from the following detailed description taken in conjunction with the accompanying drawing, in which:

FIG. 1 is an SEM image of $Cu_2SnS_3$—ZnS nanoparticles formed according to Example 1;

FIG. 2 is a TEM image of $Cu_2SnS_3$—ZnS nanoparticles formed according to Example 1;

FIG. 3 is an XRD graph of $Cu_2SnS_3$—ZnS nanoparticles formed according to Example 1;

FIG. 4 is an SEM image of $Cu_2SnS_3$—ZnS nanoparticles formed according to Example 1;

FIG. 5 is an XRD graph of $Cu_2SnS_3$—ZnS nanoparticles formed according to Example 1;

FIGS. 6A and 6B are an SEM image of a thin film prepared according to Example 17;

FIG. 7 is an XRD graph of a thin film prepared according to Example 17;

FIG. 8 is an XRD graph of a thin film prepared according to Comparative Example 3;

FIG. 9 is an XRD graph of a thin film prepared according to Comparative Example 4;

FIG. 10 is an IV characteristic graph of a thin film solar cell prepared according to Example 18;

FIG. 11 is an IV characteristic graph of a thin film solar cell manufactured according to Comparative Example 5;

FIG. 12 is an IV characteristic graph of a thin film solar cell manufactured according to Comparative Example 6;

FIG. 13 is a table illustrating SEM-EDX results of $Cu_2SnS_3$—ZnS nanoparticles demonstrating even particle distribution in particles synthesized according to the present invention;

FIGS. 14A-14E are an EDS mapping result of $Cu_2SnS_3$—ZnS nanoparticles demonstrating even metal distribution in particles synthesized according to the present invention; and FIGS. 15A-15B are a line-scan result of a $Cu_2SnS_3$—ZnS nanoparticle composition demonstrating even metal distribution in particles synthesized according to the present invention.

BEST MODE

Now, the present invention will be described in more detail with reference to the following examples. These examples are provided only for illustration of the present invention and should not be construed as limiting the scope and spirit of the present invention.

Example 1

$Cu_2SnS_3$—ZnS Particles

After adding a DEG solution including 30 mmol of thioacetamide to a DEG solution including 10 mmol of $CuCl_2$ and a DEG solution including 5 mmol of $SnCl_2$, temperature was elevated to 175° C. and then the solution was reacted while stirring for three hours. Subsequently, a DEG solution including 7 mmol of $ZnCl_2$ was slowly added to the reacted solution dropwise at room temperature. Subsequently, the solution was heated to 180° C. or more and then, maintaining the temperature, stirred for three hours. Subsequently, the solution was purified through centrifugation, resulting in $Cu_2SnS_3$—ZnS nanoparticles. A scanning electron microscope (SEM) image, a transmission electron microscope (TEM) image and an XRD graph of the formed particles are illustrated in FIGS. 1 to 3.

Example 2

$Cu_2SnS_3$—ZnS Particles

After adding a DEG solution including 30 mmol of thioacetamide to a DEG solution including 10 mmol of $CuSO_4$ and a DEG solution including 5 mmol of $SnCl_2$, temperature was elevated to 175° C. and then the solution was reacted while stirring for three hours. Subsequently, a DEG solution including 7 mmol of $ZnCl_2$ was slowly added to the reacted solution dropwise at room temperature. Subsequently, the solution was heated to 180° C. or more and then, maintaining the temperature, stirred for three hours. Subsequently, the solution was purified through centrifugation, resulting in $Cu_2SnS_3$—ZnS nanoparticles.

Example 3

Synthesis of $Cu_2SnS_3$—ZnS Particles

After adding a DEG solution including 30 mmol of thioacetamide to a DEG solution including 10 mmol of $CuSO_4$ and a DEG solution including 5 mmol of $Sn(OAc)_2$, temperature was elevated to 175° C. and then the solution was reacted while stirring for three hours. Subsequently, a DEG solution including 7 mmol of $ZnCl_2$ was slowly added to the reacted solution dropwise at room temperature. Subsequently, the solution was heated to 180° C. or more and then, maintaining the temperature, stirred for three hours. Subsequently, the solution was purified through centrifugation, resulting in $Cu_2SnS_3$—ZnS nanoparticles.

Example 4

Synthesis of $Cu_2SnS_3$—ZnS Particles

After adding a DEG solution including 30 mmol of thiourea to a DEG solution including 10 mmol of $CuCl_2$ and a DEG solution including 5 mmol of $SnCl_2$, temperature was elevated to 175° C. and then the solution was reacted while stirring for three hours. Subsequently, a DEG solution including 7 mmol of $ZnCl_2$ was slowly added to the reacted solution dropwise at room temperature. Subsequently, the solution was heated to 180° C. or more and then, maintaining the temperature, stirred for three hours. Subsequently, the solution was purified through centrifugation, resulting in $Cu_2SnS_3$—ZnS nanoparticles.

Example 5

Synthesis of $Cu_2SnS_3$—ZnS Particles

After adding a DEG solution including 15 mmol of thioacetamide to a DEG solution including 10 mmol of $CuCl_2$ and a DEG solution including 5 mmol of $SnCl_2$, temperature was elevated to 175° C. and then the solution was reacted while stirring for five hours. Subsequently, a DEG solution including 6 mmol of $ZnCl_2$ and a DEG solution including 6 mmol of thioacetamide were slowly added to the reacted solution dropwise at room temperature. Subsequently, the solution was heated to 180° C. or more and then, maintaining the temperature, stirred for three hours. Subsequently, the solution was purified through centrifugation, resulting in $Cu_2SnS_3$—ZnS nanoparticles.

Example 6

Synthesis of $Cu_2SnS_3$—ZnS Particles

After adding a DEG solution including 20 mmol of thioacetamide to a DEG solution including 10 mmol of $CuCl_2$ and a DEG solution including 5 mmol of $SnCl_2$, temperature was elevated to 175° C. and then the solution was reacted while stirring for three hours. Subsequently, a DEG solution including 6 mmol of $ZnCl_2$ and a DEG solution including 12 mmol of thioacetamide were slowly added to the reacted solution dropwise at room temperature. Subsequently, the solution was heated to 180° C. or more and then, maintaining the temperature, stirred for three hours. Subsequently, the solution was purified through centrifugation, resulting in $Cu_2SnS_3$—ZnS nanoparticles.

Example 7

Synthesis of $Cu_2SnS_3$—ZnS Particles

After adding a DEG solution including 20 mmol of thioacetamide to a DEG solution including 10 mmol of $CuCl_2$ and a DEG solution including 5 mmol of $SnCl_2$, temperature was elevated to 175° C. and then the solution was reacted while stirring for six hours. Subsequently, a DEG solution including 6 mmol of $ZnCl_2$ and a DEG solution including 12 mmol of thioacetamide were slowly added to the reacted solution dropwise at room temperature.

Subsequently, the solution was heated to 180° C. or more and then, maintaining the temperature, stirred for three hours. Subsequently, the solution was purified through centrifugation, resulting in $Cu_2SnS_3$—ZnS nanoparticles. A scanning electron microscope (SEM) image and an XRD graph of the formed particles are illustrated in FIGS. 4 and 5.

Example 8

Synthesis of $Cu_2SnS_3$—ZnS Particles

After adding an EG solution including 30 mmol of thioacetamide to an EG solution including 10 mmol of $CuCl_2$ and an EG solution including 5 mmol of $SnCl_2$, temperature was elevated to 175° C. and then the solution was reacted while stirring for three hours. Subsequently, an EG solution including 6 mmol of $ZnCl_2$ was slowly added to the reacted solution dropwise at room temperature. Subsequently, the solution was heated to 180° C. or more and then, maintaining the temperature, stirred for three hours. Subsequently, the solution was purified through centrifugation, resulting in $Cu_2SnS_3$—ZnS nanoparticles.

Example 9

Synthesis of $Cu_2SnS_3$—ZnS Particles

After adding a DEG solution including 30 mmol of thioacetamide to a DEG solution including 10 mmol of $CuCl_2$, a DEG solution including 5 mmol of $SnCl_2$ and a DEG solution including 1 mmol of PVP, temperature was elevated to 175 r and then the solution was reacted while stirring for three hours. Subsequently, an DEG solution including 7 mmol of $ZnCl_2$ was slowly added to the reacted solution dropwise at room temperature. Subsequently, the solution was heated to 180° C. or more and then, maintaining the temperature, stirred for three hours. Subsequently, the solution was purified through centrifugation, resulting in $Cu_2SnS_3$—ZnS nanoparticles.

Example 10

Synthesis of $Cu_2SnS_3$—ZnS Particles

After adding an $H_2O$ solution including 30 mmol of thioacetamide to an $H_2O$ solution including 10 mmol of $CuCl_2$ and an $H_2O$ solution including 5 mmol of $SnCl_2$, temperature was elevated to 100° C. and then reacted while stirring for three hours. Subsequently, an $H_2O$ solution including 6 mmol of $ZnCl_2$ was slowly added to the reacted solution dropwise at room temperature and then temperature was elevated to 100° C. Maintaining the temperature, the solution was stirred for three hours and then purified through centrifugation, resulting in $Cu_2SnS_3$—ZnS nanoparticles.

Example 11

Synthesis of $Cu_2SnS_3$—ZnS Particles

After adding an $H_2O$ solution including 30 mmol of thioacetamide to an $H_2O$ solution including 10 mmol of $CuCl_2$, an $H_2O$ solution including 5 mmol of $SnCl_2$ and an $H_2O$ solution including 10 mmol of sodium citrate, temperature was elevated to 100° C. and then reacted while stirring for six hours. Subsequently, an $H_2O$ solution including 6 mmol of $ZnCl_2$ and an $H_2O$ solution including 12 mmol of thioacetamide were slowly added to the reacted solution dropwise at room temperature and then temperature was elevated to 100° C. Maintaining the temperature, the solution was stirred for three hours and then purified through centrifugation, resulting in $Cu_2SnS_3$—ZnS nanoparticles.

Example 12

Synthesis of $Cu_2SnS_3$—ZnS Particles

After adding an $H_2O$ solution including 30 mmol of thioacetamide to an $H_2O$ solution including 10 mmol of $Cu(NO_3)_2$, an $H_2O$ solution including 5 mmol of $SnCl_2$ and an $H_2O$ solution including 10 mmol of sodium mesoxalate, temperature was elevated to 100° C. and then reacted while stirring for six hours. Subsequently, an $H_2O$ solution including 6 mmol of $Zn(OAc)_2$ and an $H_2O$ solution including 12 mmol of thioacetamide were slowly added to the reacted solution dropwise at room temperature and then temperature was elevated to 100° C. Maintaining the temperature, the solution was stirred for five hours and then purified through centrifugation, resulting in $Cu_2SnS_3$—ZnS nanoparticles.

Example 13

Synthesis of $Cu_2SnS_3$—ZnS Particles

After adding an $H_2O$ solution including 30 mmol of $Na_2S$ to an $H_2O$ solution including 10 mmol of $CuCl_2$ and an $H_2O$ solution including 5 mmol of $SnCl_2$, the resulting solution was reacted while stirring for three hours at room temperature. Subsequently, an $H_2O$ solution including 6 mmol of $ZnCl_2$ was slowly added to the reacted solution dropwise and then the resulting solution was stirred for three hours at room temperature. The resulting solution was purified through centrifugation, resulting in $Cu_2SnS_3$—ZnS nanoparticles.

Example 14

Synthesis of $Cu_2SnS_3$—ZnS Particles

After adding an $H_2O$ solution including 30 mmol of $Na_2S$ to an $H_2O$ solution including 10 mmol of $CuSO_4$, an $H_2O$ solution including 5 mmol of $SnCl_2$ and an $H_2O$ solution including 15 mmol of sodium citrate, the resulting solution was reacted while stirring for three hours at room temperature. Subsequently, an $H_2O$ solution including 6 mmol of $ZnCl_2$ was slowly added to the reacted solution dropwise and then the resulting solution was stirred for three hours at room temperature. The resulting solution was purified through centrifugation, resulting in $Cu_2SnS_3$—ZnS nanoparticles.

Example 15

Synthesis of $Cu_2SnS_3$—ZnS Particles

After adding an $H_2O$ solution including 30 mmol of $Na_2S$ to an $H_2O$ solution including 10 mmol of $CuSO_4$ and an $H_2O$ solution including 5 mmol of $SnCl_2$, the resulting solution was reacted while stirring for three hours at room temperature. Subsequently, an $H_2O$ solution including 6 mmol of $ZnCl_2$ was slowly added to the reacted solution dropwise and then the resulting solution was stirred for three hours at room temperature. The resulting solution was purified through centrifugation, resulting in $Cu_2SnS_3$—ZnS nanoparticles.

Example 16

Synthesis of $Cu_2SnS_3$—ZnS Particles

After adding an $H_2O$ solution including 30 mmol of $Na_2S$ to an $H_2O$ solution including 10 mmol of $Cu(NO_3)_2$ and an $H_2O$ solution including 5 mmol of $SnCl_2$, the solution was reacted while stirring for three hours at room temperature. Subsequently, an $H_2O$ solution including 6 mmol of $ZnCl_2$ was slowly added to the reacted solution dropwise and then the resulting solution was stirred for three hours at room temperature. The resulting solution was purified through centrifugation, resulting in $Cu_2SnS_3$—ZnS nanoparticles.

Comparative Example 1

After dissolving cupric acetylacetonate ($Cu(acac)_2$), zinc acetate ($Zn(OAc)_2$) and $Sn(acac)_2Br_2$ in an oleylamine solution, temperature was elevated up to 225° C. An oleylamine solution, in which S elements were dissolved, was further added thereto dropwise. Formed particles were purified through centrifugation, resulting in CZTS nanoparticles.

Comparative Example 2

After dissolving $CuCl_2 \cdot 2H_2O$, $SnCl_2$ and thioacetamide in a diethylene glycol solution, the resulting solution was heated to 175° C. for 2.5 hours. Synthesized particles were purified through centrifugation, resulting in $Cu_2SnS_3$ particles. In addition, after separately dissolving $ZnCl_2$, thioacetamide and PVP in a diethylene Glycol solution, the resulting solution was heated to 175° C. for 2.5 hours. Synthesized particles were purified through centrifugation, resulting in ZnS particles.

Example 17

Preparation of Thin Film

The $Cu_2SnS_3$—ZnS prepared according to Example 8 was dispersed in a mixture of alcohol-based solvents to prepare an ink. Subsequently, the ink was coated onto a glass substrate coated with molybdenum (Mo) to form a coating film and then the coating film was dried. Subsequently, the coating film was heated with a glass substrate deposited with Se to provide a Se atmosphere and then subjected to rapid thermal annealing (RTA) at 575° C., resulting in a CZTSSe-based thin film. An SEM image and XRD graph of the obtained thin film are illustrated in FIGS. 6A, 6B and 7, respectively.

Comparative Example 3

Preparation of Thin Film

The CZTS nanoparticles prepared according to Comparative Example 1 were dispersed in toluene as a solvent to prepare an ink, and the ink was coated onto a soda lime glass substrate coated with Mo to form a coating film. Subsequently, the coating film was dried and then subjected to heat treatment at 450° C. in a Se atmosphere, resulting in a CZTSSe-based thin film. An XRD graph of the obtained thin film is illustrated in FIG. 8.

Comparative Example 4

Preparation of Thin Film

The $Cu_2SnS_3$ nanoparticles and ZnS nanoparticles prepared according to Comparative Example 2 were dispersed in a mixture of alcohol-based solvents to prepare an ink. Subsequently, the ink was coated onto a glass substrate coated with molybdenum (Mo) to form a coating film and then the coating film was dried. Subsequently, the coating film was heated with a glass substrate deposited with Se to provide an Se atmosphere and then subjected to rapid thermal annealing (RTA) at 575° C., resulting in a CZTS Se-based thin film. An XRD graph of the obtained thin film is illustrated in FIG. 9.

Example 18

Preparation of Thin Film Solar Cell

The CZTSSe-based thin film prepared according to Example 17 was etched using a potassium cyanide (KCN) solution, a CdS layer having a thickness of 50 nm was formed thereon by chemical bath deposition (CBD), and a ZnO layer having a thickness of 100 nm and an Al-doped ZnO layer having a thickness of 500 nm were sequentially stacked thereon by sputtering, thereby completing preparation of a thin film. Subsequently, an Al electrode was formed at the thin film, thereby completing manufacture of a thin film solar cell. A graph showing current-voltage (I-V) characteristics of the thin film solar cell is illustrated in FIG. 10.

Comparative Example 5

Preparation of Thin Film Solar Cell

A CdS layer was formed on the CZTSSe-based thin film prepared according to Comparative Example 3 by chemical bath deposition (CBD) and then a ZnO layer and an ITO layer were sequentially stacked thereon by sputtering, thereby completing preparation of a thin film solar cell. A graph showing current-voltage (I-V) characteristics of the thin film solar cell is illustrated in FIG. 10.

Comparative Example 6

Preparation of Thin Film Solar Cell

A CdS layer was mounted on the CZTS Se-based thin film prepared according to Comparative Example 4 by chemical bath deposition (CBD) and then a ZnO layer and an ITO layer were sequentially stacked thereon by sputtering, thereby completing preparation of a thin film solar cell. A graph showing current-voltage (I-V) characteristics of the thin film solar cell is illustrated in FIG. 12.

Experimental Example 1

Photoelectric efficiencies of the thin film solar cells of Example 18 and Comparative Examples 5 and 6 were measured and measurement results are shown in Table 2 below and FIGS. 10 to 12.

TABLE 1

| | $J_{sc}$ (mA/cm$^2$) | $V_{oc}$ (V) | FF | Photoelectric efficiency (%) |
|---|---|---|---|---|
| Example 18 | 18.7 | 0.240 | 0.299 | 1.34 |
| Comparative Example 5 | 10.5 | 0.188 | 0.372 | 0.73 |
| Comparative Example 6 | 9.1 | 0.171 | 0.371 | 0.58 |

In Table 1, $J_{sc}$, which is a variable determining the efficiency of each solar cell, represents current density, $V_{oc}$ denotes an open circuit voltage measured at zero output current, the photoelectric efficiency means a rate of cell output according to irradiance of light incident upon a solar cell plate, and fill factor (FF) represents a value obtained by dividing the product of current density and voltage values at maximum power by the product of Voc and $J_{sc}$.

As seen in Table 1 above, when the metal chalcogenide nanoparticles prepared according to the present invention were used in light absorption layer formation, the light absorption layer showed superior photoelectric efficiency due to high current density and voltage, when compared with metal chalcogenide nanoparticles prepared according to a prior method.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

As described above, metal chalcogenide nanoparticles according to the present invention include a first phase including copper (Cu)-tin (Sn) chalcogenide and a second phase including zinc (Zn) chalcogenide in one particle. Therefore, when a thin film is prepared using the metal chalcogenide nanoparticles, generation of a second phase may be suppressed, and the thin film may have an entirely uniform composition since one particle includes all of the metals. In addition, since nanoparticles include S or Se, the nanoparticles are stable against oxidation and the amount of a Group VI element in a final thin layer may be increased. Furthermore, the volumes of particles are extended in a selenization process due to addition of a Group VI element and thereby a light absorption layer having higher density may be grown.

In addition, since the metal chalcogenide nanoparticles according to the present invention are prepared through a solution process, process costs may be dramatically reduced, when compared with conventional processes. Furthermore, a harmful reducing agent such as hydrazine is not used and, as such, risk due to use of the reducing harmful agent may be removed.

The invention claimed is:

1. A method for synthesizing metal chalcogenide nanoparticles for use in forming a light absorption layer of solar cells, the method comprising:
   preparing a first solution comprising at least one Group VI source selected from the group consisting of compounds comprising sulfur (S) or selenium (Se);
   preparing a second solution comprising a copper (Cu) salt and a tin (Sn) salt;
   preparing a third solution comprising a zinc (Zn) salt;
   mixing and reacting the first solution and the second solution for a first time at a first temperature, thereby forming a core structure;
   mixing the third solution with the reaction product of the first and second solutions for a second time,
   heating the mixed first, second, and third solutions from the first temperature to a second temperature that is higher than the first temperature, thereby forming a shell structure over the core structure,
   wherein the metal chalcogenide nanoparticles have a core-shell structure comprising a core comprising copper (Cu)-tin (Sn) chalcogenide and a shell comprising zinc (Zn) chalcogenide.

2. The method according to claim 1, further comprising adding a Group VI source to the reaction product when the third solution is mixed with the reaction product.

3. The method according to claim 1, wherein the first solution, the second solution and the third solution include solvents that are at least one selected the group consisting of water, diethylene glycol, methanol, ethanol, oleylamine, ethylene glycol, triethylene glycol, dimethyl sulfoxide, dimethyl formamide, and NMP (N-methyl-2-pyrrolidone).

4. The method according to claim 1, wherein the copper (Cu) salt, the tin (Sn) salt, and the zinc (Zn) salt are each independently at least one selected from the group consisting of a chloride, a bromide, an iodide, a nitrate, a nitrite, a sulfate, an acetate, a sulfite, an acetylacetonate, and a hydroxide.

5. The method according to claim 1, wherein the Group VI source is at least one selected from the group consisting of Se, $Na_2Se$, $K_2Se$, CaSe, $(CH_3)_2Se$, $SeO_2$, $SeCl_4$, $H_2SeO_3$, $H_2SeO_4$, $Na_2S$, $K_2S$, CaS, $(CH_3)_2S$, $H_2SO_4$, S, $Na_2S_2O_3$, $NH_2SO_3H$ and hydrates thereof, thiourea, thioacetamide, selenoacetamide, and selenourea.

6. The method according to claim 1, wherein the copper (Cu)-tin (Sn) chalcogenide is $Cu_aSnS_b$ wherein $1.2 \leq a \leq 3.2$ and $2.5 \leq b \leq 4.5$, and/or $Cu_xSnSe_y$ wherein $1.2 \leq x \leq 3.2$ and $2.5 \leq y \leq 4.5$.

7. The method according to claim 1, wherein the zinc (Zn) chalcogenide is ZnS and/or ZnSe.

8. The method according to claim 1, wherein a composition ratio of the metal in the metal chalcogenide nanoparticles is determined in a range of $0.5 \leq Cu/(Zn+Sn) \leq 1.5$ and $0.5 \leq Zn/Sn \leq 2.0$.

9. The method according to claim 8, wherein a composition ratio of the metal in the metal chalcogenide nanoparticles is determined in a range of $0.7 \leq Cu/(Zn+Sn) \leq 1.2$ and $0.8 \leq Zn/Sn \leq 1.4$.

10. The method according to claim 1, wherein the core has a diameter of 5 nanometers to 200 nanometers.

11. The method according to claim 1, wherein the shell has a thickness of 1 nanometer to 100 nanometers.

12. The method of claim 1, wherein the first solution comprises 15 mmol to 30 mmol of the Group VI source, the second solution comprises 10 mmol of the Cu salt and 5 mmol to 7 mmol of the Sn salt, and the third solution comprises 6-7 mmol of the Zn salt.

13. The method of claim 12, wherein at least one of the first and second solutions comprises a capping agent.

14. The method of claim 1, wherein the first and second time periods are each at least 3 hours.

15. The method of claim 1, wherein the first temperature is 175° C.

16. The method of claim 1, wherein the third solution is added dropwise to the reaction product of the first and second solutions, and the third solution is at room temperature when it is added to the reaction product.

17. The method of claim 1, wherein the second temperature is 180° C.

* * * * *